US009431504B2

(12) United States Patent
Yin et al.

(10) Patent No.: US 9,431,504 B2
(45) Date of Patent: Aug. 30, 2016

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huaxiang Yin, Beijing (CN); Yongkui Zhang, Beijing (CN); Zhiguo Zhao, Beijing (CN); Zhiyong Lu, Beijing (CN); Huilong Zhu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/696,616

(22) Filed: Apr. 27, 2015

(65) Prior Publication Data

US 2016/0087063 A1    Mar. 24, 2016

(30) Foreign Application Priority Data

Sep. 19, 2014    (CN) .......................... 2014 1 0484648

(51) Int. Cl.
| H01L 29/49 | (2006.01) |
| H01L 29/10 | (2006.01) |
| H01L 29/66 | (2006.01) |
| H01L 21/8234 | (2006.01) |
| H01L 27/088 | (2006.01) |
| H01L 21/265 | (2006.01) |

(52) U.S. Cl.
CPC ... *H01L 29/4916* (2013.01); *H01L 21/823412* (2013.01); *H01L 21/823418* (2013.01); *H01L 21/823431* (2013.01); *H01L 21/823437* (2013.01); *H01L 21/823468* (2013.01); *H01L 27/0886* (2013.01); *H01L 29/1083* (2013.01); *H01L 29/66492* (2013.01); *H01L 29/66537* (2013.01); *H01L 29/66545* (2013.01); *H01L 21/26586* (2013.01)

(58) Field of Classification Search
None
See application file for complete search history.

(56) References Cited

U.S. PATENT DOCUMENTS

| 2014/0138780 A1* | 5/2014 | Colinge | H01L 29/66795 257/402 |
| 2014/0327090 A1* | 11/2014 | Cai | H01L 29/66545 257/401 |
| 2015/0200302 A1* | 7/2015 | Doornbos | H01L 29/66795 257/401 |
| 2015/0303284 A1* | 10/2015 | Basker | H01L 29/66803 257/288 |
| 2015/0357440 A1* | 12/2015 | Cheng | H01L 29/66795 257/401 |

OTHER PUBLICATIONS

Ngai, T., et. al., "Simple FinFET Gate Doping Technique for Dipole-engineered Vt Tuning and CET Scaling." Proceedings of Technical Program of 2012 VLSI Technology, System and Application (2012).*

* cited by examiner

*Primary Examiner* — Joseph Schoenholtz
(74) *Attorney, Agent, or Firm* — McDermott Will & Emery LLP

(57) ABSTRACT

A semiconductor device is provided that has a plurality of Fin structures extending on a substrate along a first direction; a gate stack structure extending on the substrate along a second direction and across the plurality of Fin structures, wherein the gate stack structure comprises a gate conductive layer and a gate insulating layer, and the gate conductive layer is formed by a doped poly-semiconductor; trench regions in the plurality of Fin structures and beneath the gate stack structure; and source/drain regions on the plurality of Fin structures and at both sides of the gate stack structure along the first direction. A method of manufacturing a semiconductor device is also provided.

9 Claims, 14 Drawing Sheets

SEMICONDUCTOR DEVICE AND METHOD FOR MANUFACTURING THE SAME

CROSS-REFERENCE TO RELATED APPLICATIONS

This application claims priority to a Chinese Application No. 201410484648.0, filed on Sep. 19, 2014, entitled "SEMICONDUCTOR DEVICE AND METHOD FOR MANUFACTURING THE SAME", which is incorporated herein by reference in its entirety.

FIELD OF INVENTION

The present invention relates to a semiconductor device and a method for manufacturing the same, especially to a FinFET in a doped polysilicon gate-last process and a method for manufacturing the same.

BACKGROUND

In the current sub-20 nm technology, three dimensional (3D) multi-gate devices (FinFETs or Tri-gates) are primary device structures, which improve gate controllability and suppress current leakage and Short Channel Effects (SCE). Compared with the conventional single-gate bulk Si or SOI MOSFETs for example, dual-gate SOI structures can suppress the SCE and Drain Induction Barrier Lower (DIBL) effects, have a lower junction capacitance to achieve a lightly-doped channel, and can adjust a threshold voltage by setting a work function of a metal gate to increase a driving current by a factor of about 2, thereby reducing the requirements on Equivalent Oxide Thickness (EOT). Compared with the dual-gate devices, the tri-gate devices have gates surrounding the top surface and opposite sides of the channel, thereby achieving more powerful gate controllability. Further, all-around nanowire multi-gate devices are more advantageous.

In general, a method for manufacturing a FinFET structure comprises: etching in a bulk Si or SOI substrate to form a plurality of Fins and trenches extending in parallel along a first direction; filling the trenches with an insulating material, and implementing etch-back to expose a part of the Fins to form a Shallow Trench Isolation (STI); depositing a thin (merely 1-5 nm, for example) dummy gate insulating layer (generally silicon oxide) on the top and sidewalls of the Fins, and depositing a dummy gate layer (generally polysilicon or amorphous silicon) and a dummy gate blanket layer (generally silicon nitride) on the dummy gate insulating layer; etching the dummy gate layer and the dummy gate insulating layer to form a dummy gate stack extending along a second direction, wherein the second direction is preferably perpendicular to the first direction; implementing a lightly doping implantation process in an inclination angle on the Fins by taking the dummy gate stack as a mask to form a Light Doping Drain (LDD) structure, in particular, a Source Drain Extension (SDE) structure to suppress DIBL effects; depositing and etching at both sides of the dummy gate stack along the first direction to form a gate spacer; epitaxially growing materials with similar lattice constants at both sides of the gate spacer to form source/drain regions with high stress (the gate spacer, the top of the dummy gate stack and the like cannot have a semiconductor material grown epitaxially thereon as they are made of an insulating dielectric material), wherein a material such as SiGe, SiC and the like with higher stress than Si is preferably used to improve carrier mobility; preferably, forming a Contact Etching Stop Layer (CESL) on the source/drain regions; depositing an Inter-Layer Dielectric (ILD) layer on a wafer; etching to remove the dummy gate stack and leave gate trenches in the ILD layer; and depositing, in the gate trenches, a gate insulating layer of a High-k (HK) material, a gate conductive layer of a metal/metal alloy/Metal Nitride (MG), and preferably a gate blanket layer of a nitride material to protect the metal gate. Further, source/drain contact holes are formed by etching the ILD layer using a mask to expose the source/drain regions; and alternatively, metal silicide is formed in the source/drain contact holes to reduce source/drain contact resistances. A contact plug is formed by filling with metal/metal nitride, preferably metal such as W, Ti and the like with a high filling rate. Due to the existence of the CESL and the gate spacer, the filling metal W and Ti will align with the source/drain regions automatically, to finally form the contact plug.

However, although the metal gate and the gate stack structure formed by a high-k material as mentioned above can effectively improve gate controllability, for example, effectively suppress the SCE and accurately adjust a threshold voltage, with the continuous shrinking of the characteristic size (a length of the trench regions, which typically is slightly larger than or equal to a length/width of the metal gate stack along a first direction) of the FinFET device to less than for example 10 nm or even 8 nm, it is difficult to effectively improve the gate trenches formed by a metal material filling gate-last process, and the cost remains at a high level due to the complexity of the process. On the other hand, the conventional polysilicon gate structure which is applied to a planar large-scaled MOSFET is difficult to be applied to the FinFET in a gate-last process, since it is difficult for a device with a short channel and a short gate length to accurately control uniform distribution of the doping agent in the narrow gate, and therefore, the formed polysilicon gate meets technical challenges such as difficulty in control of the SCE, difficulty in accurate adjustment of the threshold voltage and the like.

SUMMARY OF THE INVENTION

As mentioned above, the object of the present disclosure is to overcome the above mentioned technical difficulties and to propose a novel FinFET structure and a method for manufacturing the same so as to effectively improve the adjusting accuracy of the threshold voltage of the doped poly-semiconductor gate and suppress SCE at a low cost.

Thus, the present disclosure provides a semiconductor device, comprising: a plurality of Fin structures extending on a substrate along a first direction; a gate stack structure extending on the substrate along a second direction and across the plurality of Fin structures, wherein the gate stack structure comprises a gate conductive layer and a gate insulating layer, and the gate conductive layer is formed by a doped poly-semiconductor; trench regions in the plurality of Fin structures and beneath the gate stack structure; and source/drain regions on the plurality of Fin structures and at both sides of the gate stack structure along the first direction.

Among others, the doped poly-semiconductor comprises a material selected from a group consisting of poly-Si, poly-SiGe, poly-Si:C, poly-Si:H, poly-Ge, poly-SiGeC, poly-GeSn, poly-SiSn, poly-InP, poly-GaN, poly-InSb and poly-carbonized semiconductor or combinations thereof.

Among others, the source/drain regions comprises source/drain extension regions in the plurality of Fin structures and raised source/drain regions above the source/drain extension regions.

Among others, a punch through stop layer is in the middle and/or at the bottom of the plurality of Fin structures.

Among others, for pFinFET devices, impurities in the poly-semiconductor are p-type impurities which are selected from a group consisting of B, In, Ga, Al, Mg and Sn or combinations thereof; and for nFinFET devices, the impurities in the poly-semiconductor are n-type impurities which are selected from a group consisting of P, As, Te, Se, Sb and S or combinations thereof.

The present disclosure further provides a method for manufacturing a semiconductor device, comprising: forming a plurality of Fins extending along a first direction on a substrate; forming a dummy gate stack structure extending along a second direction on the Fins; forming doped source/drain regions in and/or on the Fins at both sides of the dummy gate stack structure along the first direction, and forming channel regions in a part of the Fins between the source/drain regions beneath the dummy gate stack structure; forming an inter-layer dielectric layer on the substrate, and selectively etching to remove the dummy gate stack structure and leave the gate trenches in the inter-layer dielectric layer; depositing a gate insulating layer and a poly-semiconductor layer in turn in the gate trenches and on the top of the inter-layer dielectric layer; doping the poly-semiconductor layer to form a doped poly-semiconductor layer as a gate conductive layer; and implementing activation and annealing to activate the dopants in the source/drain regions and the gate conductive layer at the same time, so as to facilitate the dopants to be uniformly distributed in the gate conductive layer.

Among others, the method further comprises: prior to forming the gate stack structure, implementing ion implantation to form a punch through stop layer in the middle and/or at the bottom of the Fins.

Among others, the doped poly-semiconductor comprises a material selected from a group consisting of poly-Si, poly-SiGe, poly-Si:C, poly-Si:H, poly-Ge, poly-SiGeC, poly-GeSn, poly-SiSn, poly-InP, poly-GaN, poly-InSb and poly-carbonized semiconductor or combinations thereof.

Among others, forming source/drain regions further comprises: forming a first gate spacer at both sides of the dummy gate stack structure; implementing lightly-doping ion implantation on the Fins by taking the first gate spacer as a mask, to form source/drain extension regions; epitaxially growing raised source/drain regions on the source/drain extension regions at both sides of the first gate spacer; forming a second gate spacer at both sides of the first gate spacer; and implementing heavily-doping ion implantation on the raised source/drain regions by taking the second gate spacer as a mask.

Among others, the lightly doping ion implantation is ion implantation in a inclination angle, wherein the inclination angle is adjusted to control a junction depth of the extended source/drain regions.

Among others, after implementing activation and annealing, the gate conductive layer and the gate insulating layer are polarized until the inter-layer dielectric layer is exposed.

Among others, for pFinFET devices, impurities in the poly-semiconductor are p-type impurities which are selected from a group consisting of B, In, Ga, Al, Mg and Sn or combinations thereof; and for nFinFET devices, the impurities in the poly-semiconductor are n-type impurities which are selected from a group consisting of P, As, Te, Se, Sb and S or combination thereof.

According to the semiconductor device and the method for manufacturing the same of the present disclosure, in the gate-last process, after the poly-semiconductor gate is doped and then annealing is implemented synchronously on the poly-semiconductor gate and the source/drain regions at both sides thereof so that the dopants are uniformly distributed, which can effectively improve the adjusting accuracy of the threshold voltage of the doped poly-semiconductor gate, and suppress SCE at a low cost.

BRIEF DESCRIPTION OF THE DRAWINGS

The technical solutions of the present disclosure would be illustrated in detail by referring to the accompany figures, in which.

DETAILED DESCRIPTION OF PREFERRED EMBODIMENTS

The characteristic and effect of the present disclosure would be illustrated in detail by referring to the accompany figures and in conjunction with the embodiments. The present disclosure discloses a 3D multi-gate FinFET and a method for manufacturing the same which effectively improves the adjusting accuracy of the threshold voltage of the poly-semiconductor gate. It should be noted that similar reference signs refer to similar structure. The terms such as "first", "second", "upper", "lower" and the like are used to illustrate the respective device structures or the manufacturing procedures. Unless there is specially stated, those terms do not indicate the relationship of the device structure and manufacturing procedure in space, order or rating.

Figure 14:
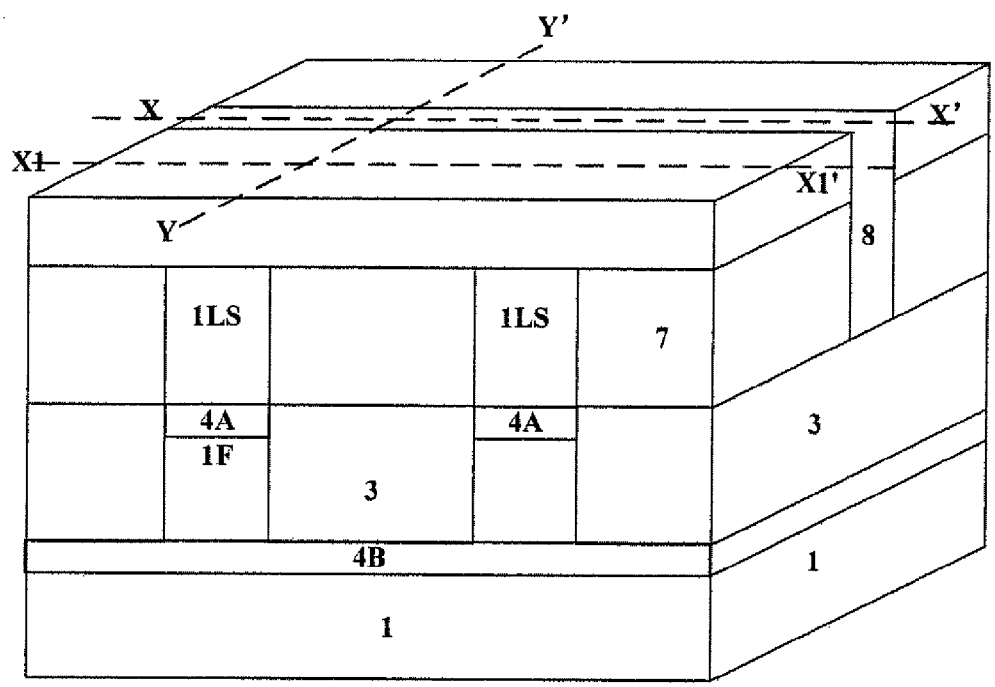
FIG. 14 is a perspective view of the FinFET device according to the present disclosure.

It should be noted that the upper portion in the respective figures show a sectional view of the device along the first direction in FIG. 14 (the extending direction of the Fin and the extending direction of the source/drain regions, i.e. Y-Y' axial line). The middle portions show a sectional view of device along the central line of the gate stack in a second direction (the extending direction of the gate stack perpendicular to the first direction, i.e. X-X' axial line). The lower portions show a sectional view of the device obtained at a position parallel to the second direction and outside of the gate stack (there is a certain distance along the first direction).

Figure 1:
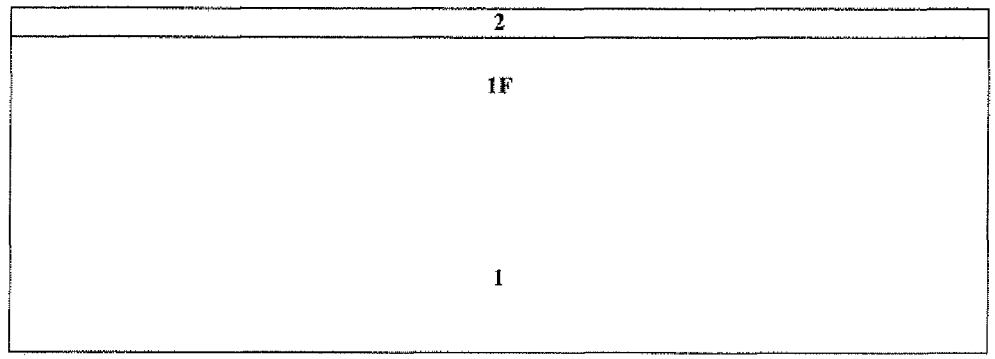
FIG. 1 to FIG. 13 are schematic views of the respective steps of the method for manufacturing a FinFET according to the present disclosure.
Figure 1:
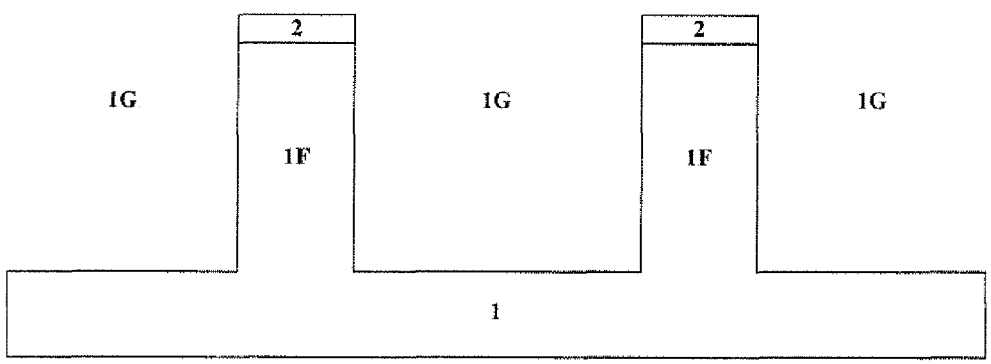
Figure 1:
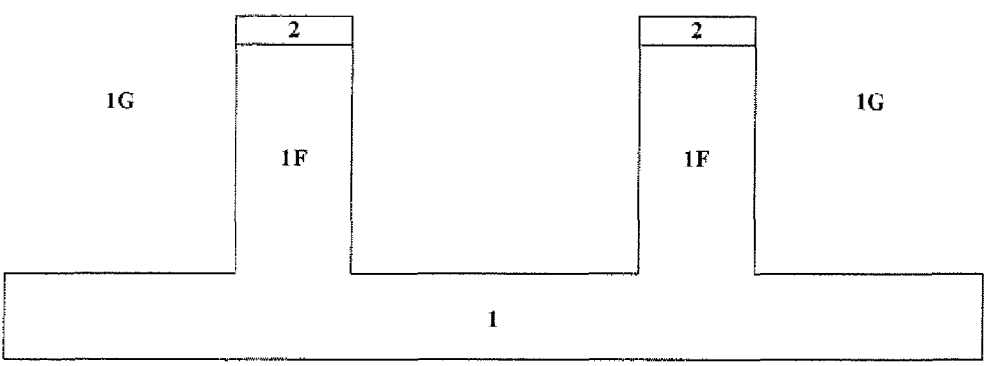

As shown in FIG. 1, a plurality of Fin structures 1F and trenches 1G between the Fin structures are formed on a substrate 1 along a first direction. The first direction is an extending direction of a channel region of the device in future (the Y-Y' axis line in FIG. 14). The substrate 1 is provided. The substrate 1 may be appropriately selected according to the usage of the device and may comprises one of monocrystal bulk silicon (Si), a monocrystal bulk germanium (Ge), a strained silicon (Strained Si), silicon germanium (SiGe), a semiconductor compound material such as Gallium Nitride (GaN), Gallium Arsenide (GaAs), Indium Phosphide (InP), Indium Antimonide (InSb), or a carbon-based semiconductor such as Graphene, SiC, Carbon nanotube, and the like. In consideration of the compatibility with a CMOS process, the substrate 1 is preferably bulk silicon. Alternatively, a hard mask layer 2 is formed on the substrate 1, for example, a silicon nitride or silicon oxynitride layer 2 formed by a process such as LPCVD, PECVD, sputtering and the like. A photoresist is applied on the hard mask layer 2 and is exposed and developed to form a photoresist pattern (not shown). The hard mask layer 2 is etched to form a hard mask pattern by taking the photoresist pattern as a mask, and the substrate 1 is further etched by further taking the hard mask pattern 2 as a mask, so as to form a plurality of trenches 1G extending in parallel along a first direction and Fins 1F composed of the remaining substrate 1 between the trenches 1G. Preferably, the etching is anisotropic etching, such as a plasma dry etching, reactive ion etching (RIE) or Tetramethylammonium hydroxide Beilstein (TMAH) wet etching, so that a depth-width ratio of the trench 1G is preferably larger than 5:1. A width of the Fin 1F along a second direction is, for example, only 5-50 nm, and preferably ranging from 1-20 nm.

Figure 2:
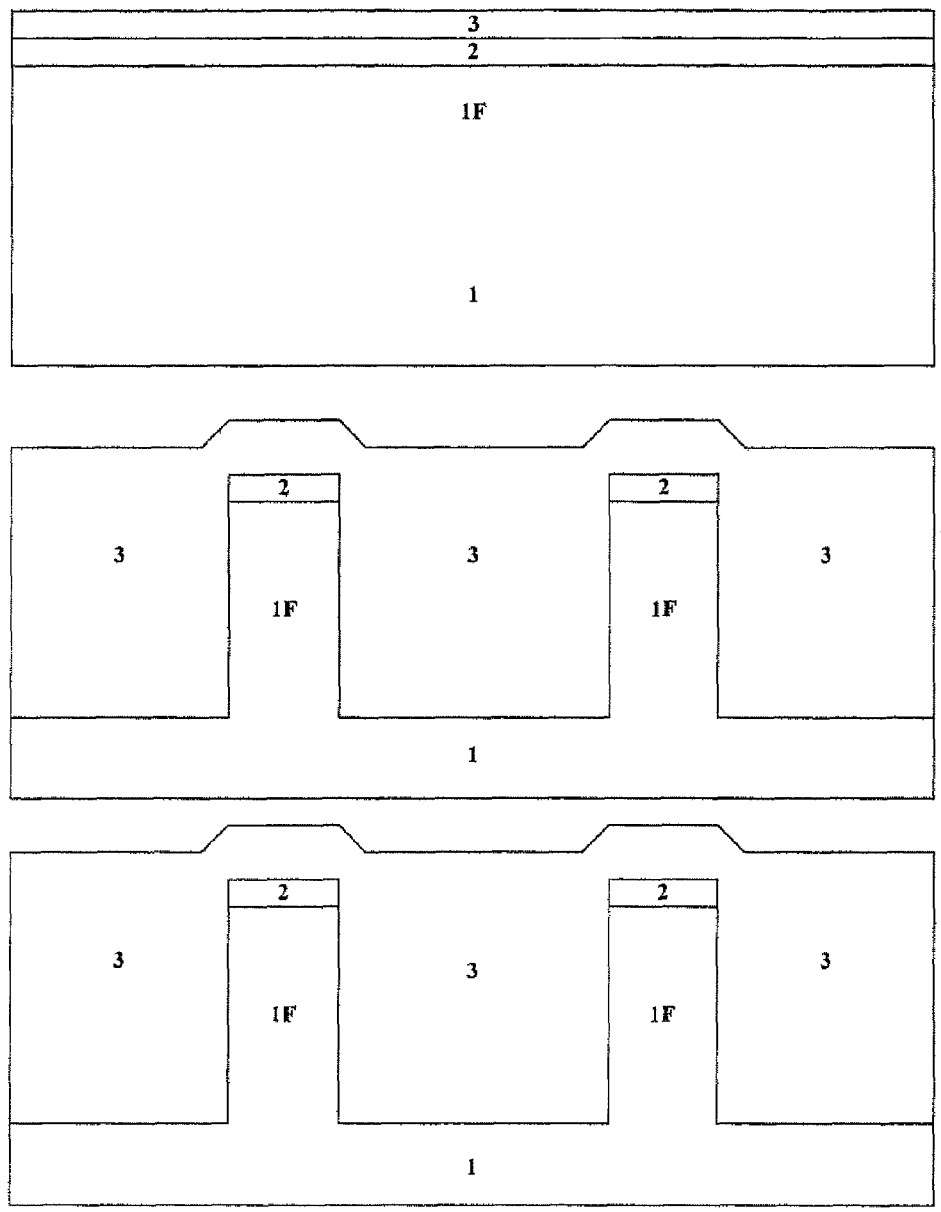

As shown in FIG. 2, an isolating dielectric layer 3 is formed between the Fin structure 1F and the substrate 1. For example, an insulating isolation dielectric layer 3 is formed in the trenches 1G between the Fins 1F by depositing a filling material such as silicon oxide, silicon oxynitride, silicon hydroxide, organic substrate and the like by a process such as PECVD, HDPCVD, RTO (rapid thermally oxidation), spin coating, FlowCVD and so on. As shown in FIG. 2, due to the existence of the Fin structure 1F, the deposited layer 3 has protrusions on the top of the Fin structure 1F. Preferably, the layer 3 is processed by a planarization process such as CMP, Etch-back and the like until the hard mask layer 2 is exposed.

Figure 3:
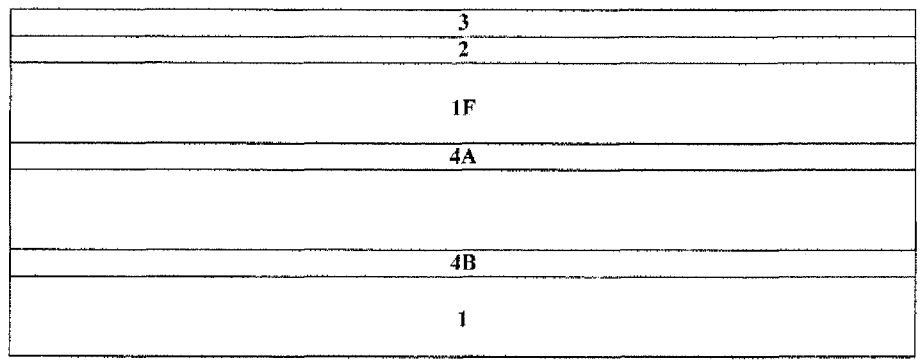
Figure 3:
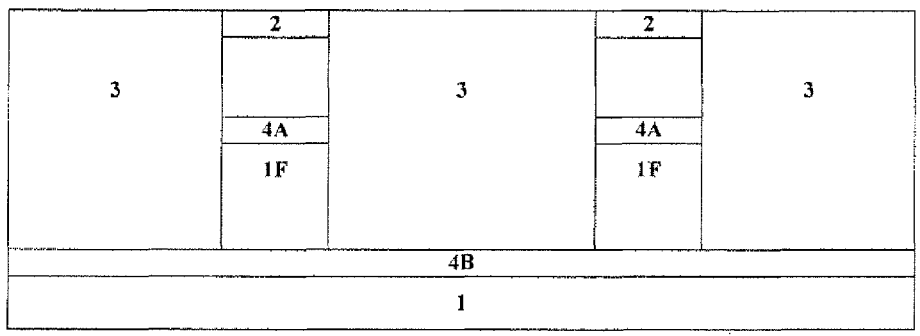
Figure 3:
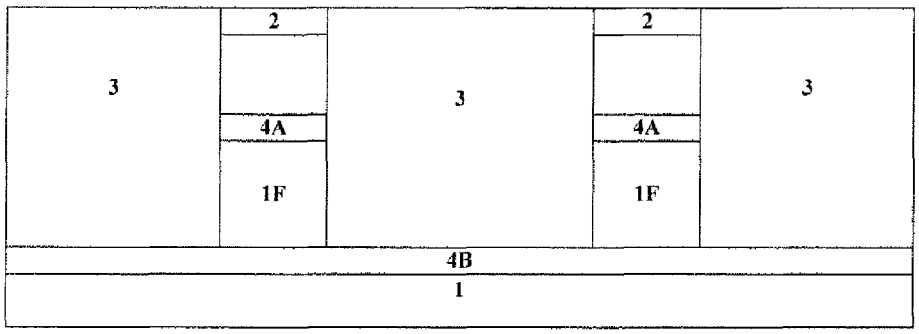

As shown in FIG. 3, a punch through stop layer (PTSL) 4 is formed in the Fin 1F and/or at the bottom. After the structure shown in FIG. 2 is planarized to expose the hard mask layer 2, an ion implantation is implemented, and the ions may comprise one of N, C, F, P, Cl, As, B, In, Sb, Ga, Si, Ge and combination thereof. Subsequently, an annealing is implemented, for example, thermal processed at a temperature of about 500-1200 Celsius degree for about 1 ms-10 min, so that the implanted element reacts with the Fin 1F to form a highly doped (doped with the Si in the above mentioned materials) or insulating (e.g. doped with the silicon oxide in the above mentioned materials) punch through stop layer 4. In one embodiment of the present disclosure, the doping energy and doping dosage are controlled to form a channel punch through stop layer 4A only in the Fin 1F, as shown in FIG. 3, so as to suppress the leakage from the channel region through the side surface of the STI region. However, in another preferable embodiment of the present disclosure, the doping energy and doping dosage are controlled so that the punch through stop layer 4 is further distributed at an interface between the bottom of the Fin 1F and the substrate 1 as a STI punch through stop layer 4B, so as to effectively isolate an leakage current between the channel region and source/drain regions in the Fin 1F as well as the active region of the adjacent Fins. The material for the layer 4B may be identical to that of the layer 4A, and may also contain different component from the above mentioned elements (but at least containing oxygen). The layer 4B and the layer 4A may be synchronously formed by one batch of implantation (the implantation depths for different elements are different from each other), and may also be formed by two implantation steps with different depths and dosages, for example, the layer 4B is formed by an implantation with a deep depth and then the layer 4A is formed by an implantation with a shallow depth, vice versa. In addition, except for the highly doped punch through stop layer as mentioned above, an amount of oxygen (O) may be implanted to form a silicon oxide based insulating layer as the punch through stop layer (the silicon oxide layer may be further doped with the above mentioned impurity). It should be noted that the distance from the channel punch through stop layer 4A to the top (or bottom) of the Fin 1F may be arbitrarily set, and in one embodiment of the present disclosure, it is preferably set to be ⅓-½ of height of the Fin 1F itself. For example, the thickness of the STI punch through stop layer 4B and the channel punch through stop layer 4A may range from 5-30 nm. The width of the layer 4B (along the first and/or second direction) may be set according to the width of the active region of the whole device and the width of the layer 4A is identical to that of the Fin 1F, i.e. the width of the layer 4B is obviously larger than that of the layer 4A.

Figure 4:
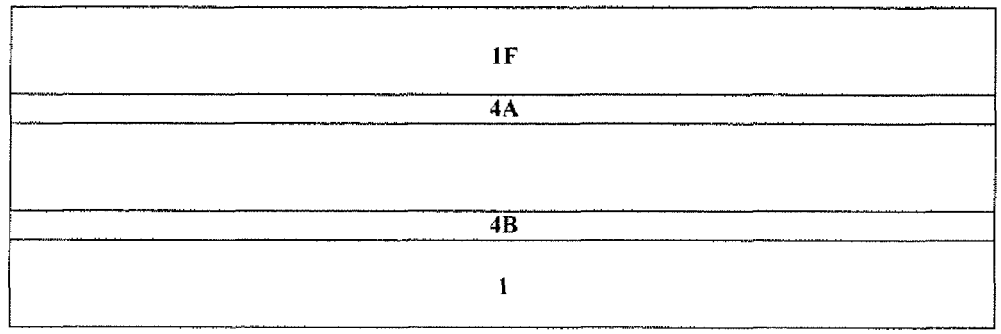
Figure 4:
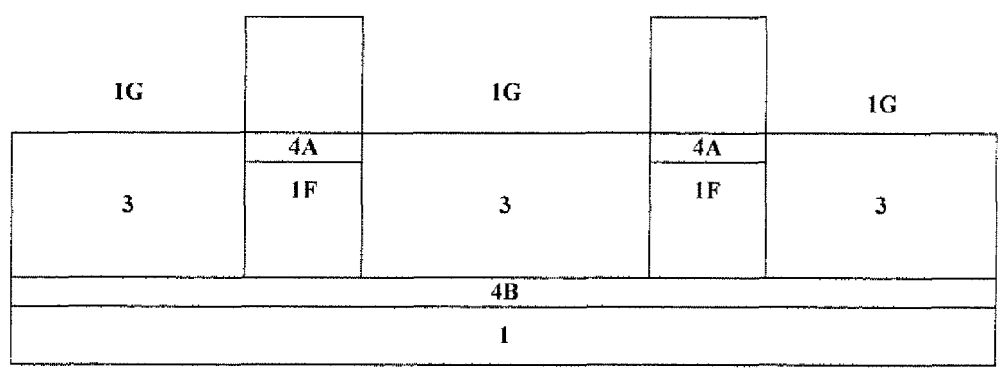
Figure 4:
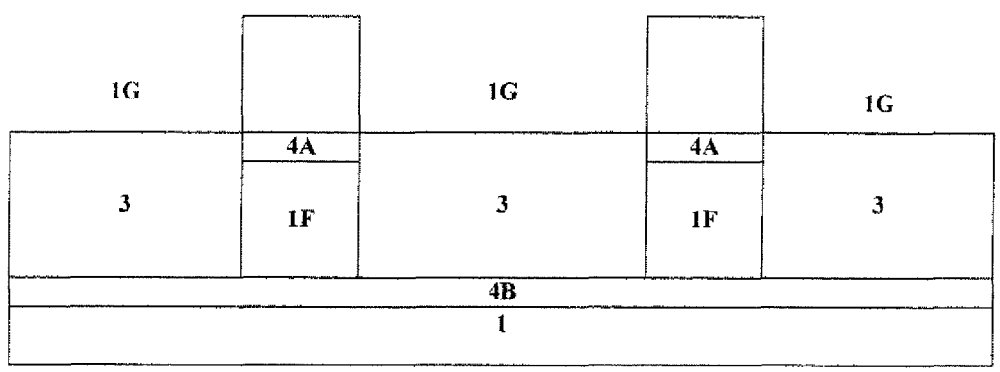

As shown in FIG. 4, the isolating layer 3 is selectively etched to form a trench 1G again and to expose one portion of the Fin 1F. The isolating layer 3 is etched by selecting an anisotropic etching such as plasma dry etching and RIE and by utilizing the photoresist pattern or other hard mask pattern, so that the remaining isolating layer 3 forms a shallow trench isolation (STI) region 3. Preferably, the depth of the trench 1G, i.e. the distance from to the top of the STI region 3 to the top of the Fin 1F, is larger than or equal to the distance from the top of the punch through stop layer 4A to the top of the Fin 1F, so as to completely suppress the punching through between the channel regions. Subsequently, the hard mask 2 is removed by a wet etching.

Figure 5:
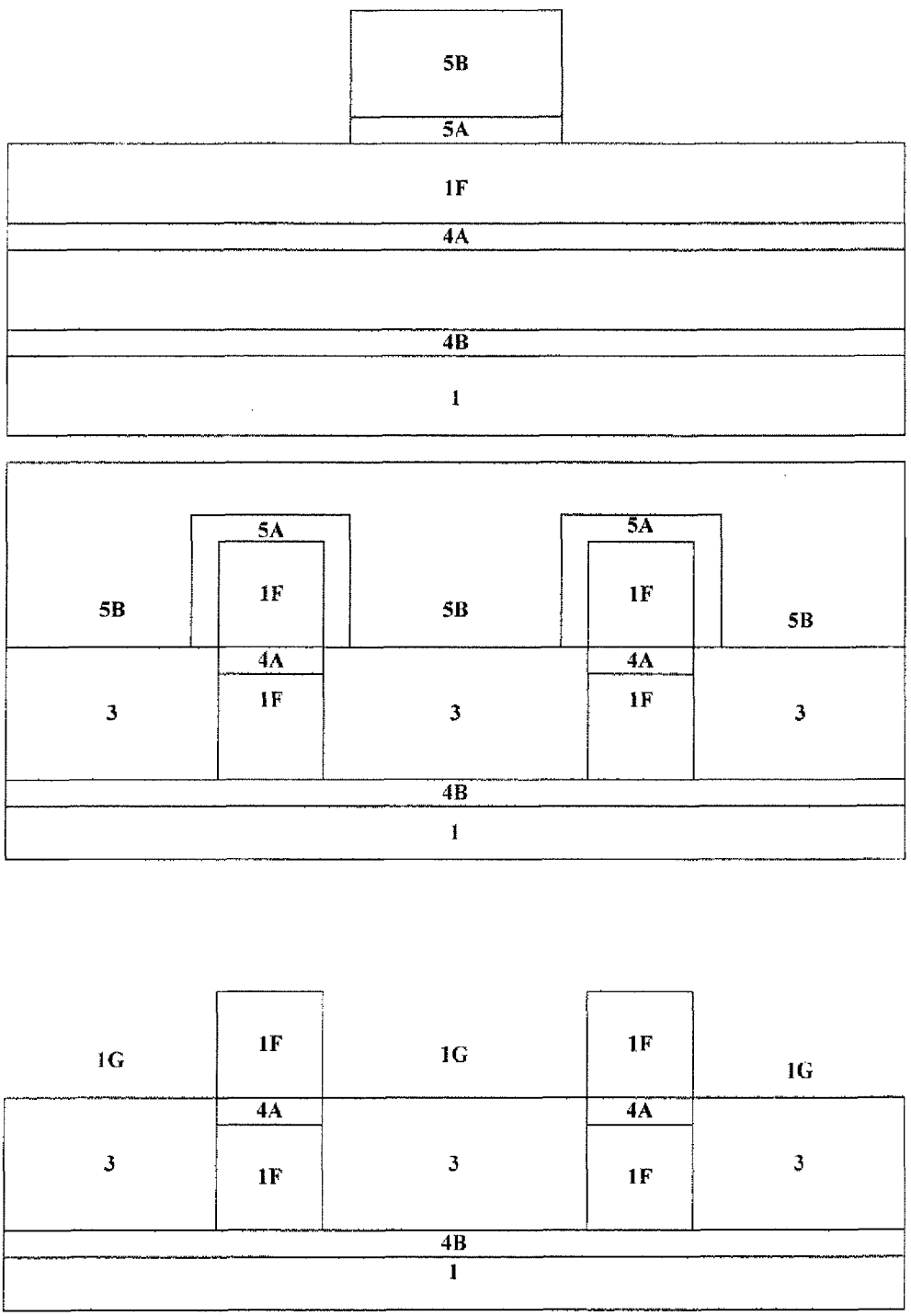

As shown in FIG. 5, a dummy insulating layer 5A and a dummy gate layer 5B are formed on the whole wafer, i.e., on the Fin 1F and the STI 3. For example, the dummy insulating layer 5A and the dummy gate layer 5B are formed on the whole device structure by a conventional process such as PECVD, HDPCVD, MOCVD, MBE, ALD, evaporating, sputtering and the like. For example, the dummy insulating layer 5A may be formed of a material such as oxide, nitride, oxynitride and the like. The dummy gate layer 5B may be formed of a material such as poly-Si, SiGe, amorphous Si, amorphous C and the like. Then, for example, a photoresist (not shown) is applied on the whole device, and is subjected to exposure and development by using a mask or a ruling plate a having lines extending along the second direction (which is preferably perpendicular to the direction in which the Fins 1F extend) to form a plurality of photoresist patterns extending along the second direction. Then, the dummy gate layer 5B and the dummy insulating layer 5A are etched in turn by taking the photoresist patterns as a mask, until the top of the Fin structures 1F and the top of the STI 3 are exposed. The etching process is preferably an anisotropic etching, for example, plasma dry etching, RIE and the like. The etching gases may be fluorocarbon-based etching gases for a Si-based material (for example, poly-Si, silicon oxide, silicon nitride and the like), or may also be halogen etching gases (for example, $Cl_2$, $Br_2$, HBr, HCl and the like) for a non-Si-based material (for example, poly-SiGe, poly-Ge, or other high-k material), to form lines extending along the second direction, and expose the trenches 1G between the Fins 1F again as shown in the lower portion of FIG. 5.

Figure 6:
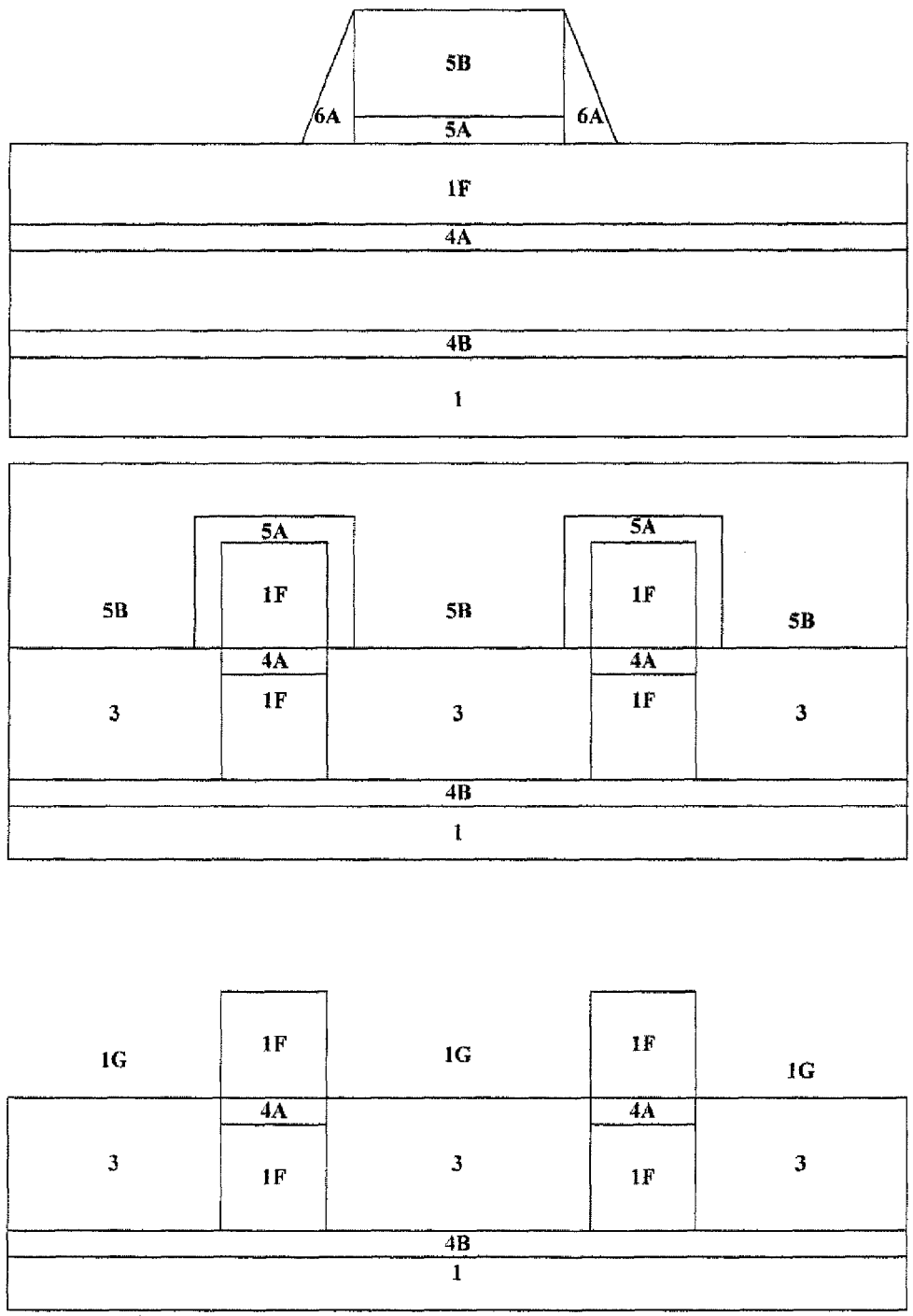

As shown in FIG. 6, a first gate spacer 6A is formed at both sides of the dummy gate stack 5 along the first direction. An insulating material layer 6 is formed on the whole device by a process such as LPCVD, PECVD, HDPCVD, UHVCVD, MOCVD, MBE, ALD, evaporation, (magnetron) sputtering and the like. The insulating material layer 6 is made of a material such as silicon nitride, silicon oxynitride, silicon oxide, C-containing silicon oxide, amorphous carbon, Diamond-Like amorphous Carbon (DLC) and a combination thereof. In an embodiment of the present disclosure, the material is preferably silicon nitride. Then, the insulating material layer 6 is etched by an anisotropic etching process, to leave the first gate spacer 6A only at both sides of the dummy gate stack structure 5 along the first direction. It should be noted that although the first gate spacer 6A is in a triangular shape as shown in FIG. 6, in another preferable embodiment of the present disclosure, the spacer 6A is preferably in an L shape. That is to say, the spacer 6A has a first horizontal portion and a second vertical portion to keep good conformation with the dummy gate stack 5, thereby achieving a reduced thickness of the gate spacer 6A, a further reduced size of the device, and improved uniformity of the device. In a preferable embodiment of the present disclosure, the layer 6A may have a thickness of merely 1-5 nm for example, and preferably, 2-4 nm, and most preferably, 3 nm.

Figure 7:
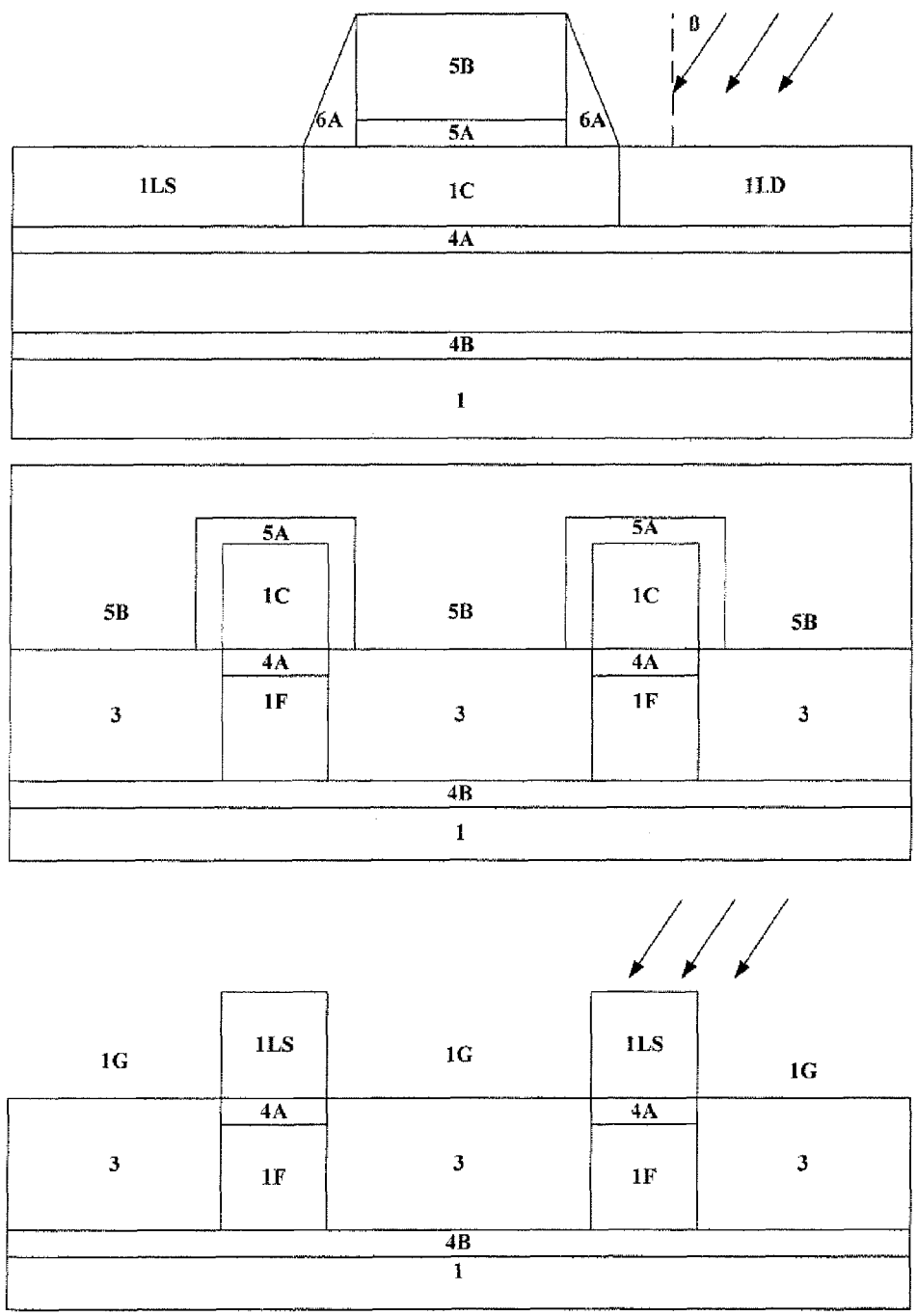

As shown in FIG. 7, lightly-doping ion implantation is implemented on the wafer including the device by taking the first gate spacer 6A as a mask, to form LDD or SDE structures 1LS/1LD in Fin 1F at both sides of the dummy gate stack 5 and the gate spacer 6A along the first direction, and the Fin 1F between the LDD or SDE structures 1LS/1LD serve as a trench region 1C. A vertical inclination angle β (an acute angle between the implantation direction and the vertical direction) may be 0-45±0.5° for example. A symmetric LDD/SDE structure may be formed at both sides of the gate stack structure 5 along the first direction by rotating the substrate 1 of the wafer or rotating a nozzle in an ion implementation chamber 180 degree by taking the vertical direction as an axial line. In addition, according to a preferable embodiment of the present disclosure, the vertical inclination angle β may be adjusted by changing a longitudinal junction depth (along the vertical direction) of the LDD/SDE structure, thereby controlling the characteristics of the bottom interface between the source/drain regions and the Fin 1F.

Figure 8:
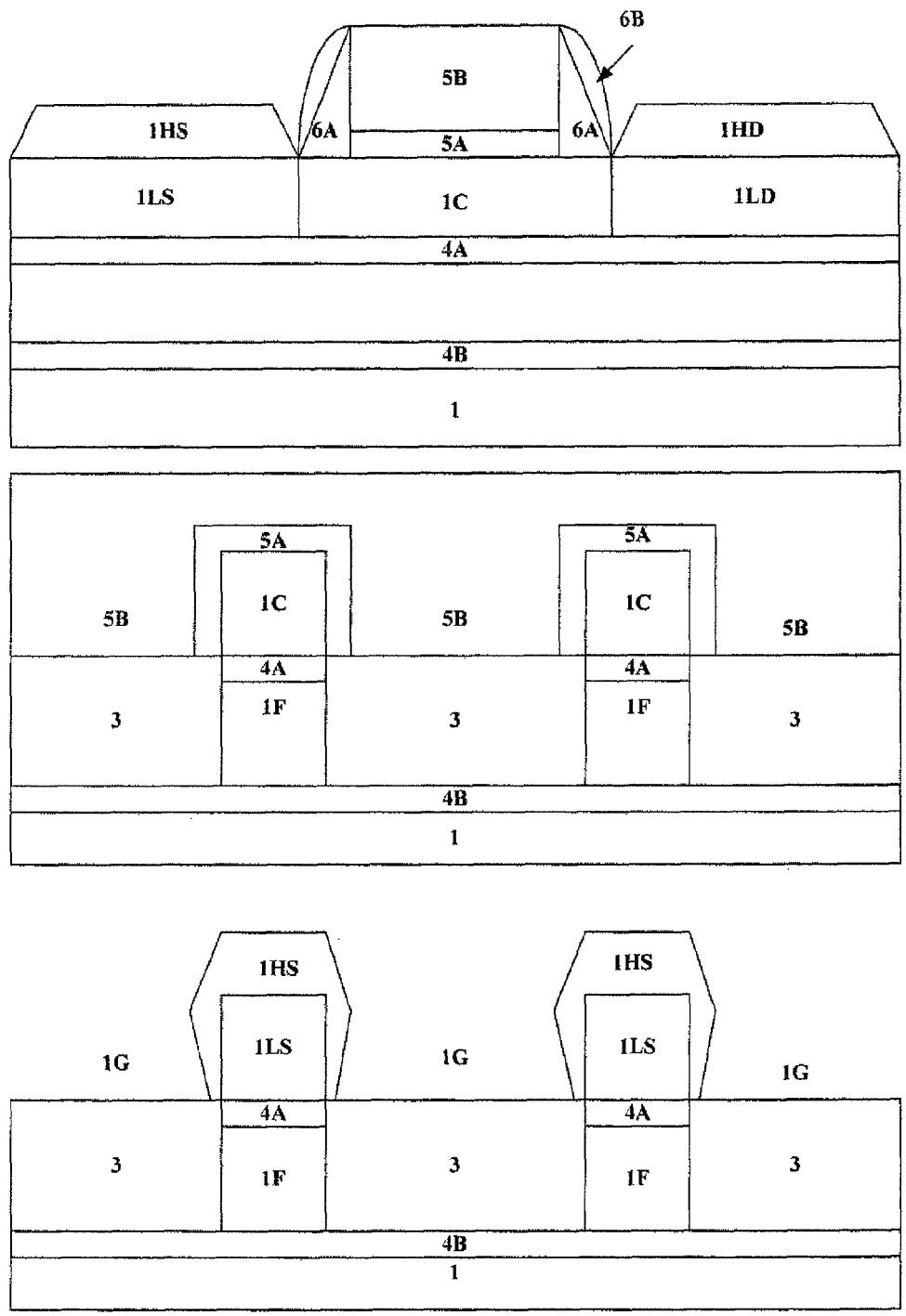

As shown in FIG. 8, raised source/drain regions 1HS/1HD are grown epitaxially on LDD source/drain regions 1LS/1LD at both sides of the gate spacer 6A along the first direction. For example, the raised source/drain regions 1HS/1HD are grown epitaxially at both sides of the gate stack structure 5/gate spacer 6A along the first direction by a process such as PECVD, MOCVD, MBE, ALD, thermal decomposition, evaporation, sputtering and the like. The raised source/drain regions 1HS/1HD may preferably be of a different material from the substrate 1 and the Fins 1F, for example, SiGe, Si:C, Si:H, SiSn, GeSn, SiGe:C and a combination thereof with higher stress. As shown in the lower portion of FIG. 8, as epitaxial growth has different growth rates in various facets, the finally formed raised source/drain regions tend to have a cross section of rhombus or diamond shape. Preferably, after the raised source/drain regions are formed, a second gate spacer 6B is further formed on the first gate spacer 6A using the similar process and material, and the raised source/drain regions are doped through ion implantation by using the second gate spacer 6B as a mask, to reduce the contact resistance of the source/drain regions. It should be noted that after the raised source/drain regions are doped, the activation and annealing process is not immediately implemented. Instead, after the poly-semiconductor gate is doped in a subsequent process, the dopants are activated synchronously, so that the process thermal budget is saved, and the implanted ions are distributed uniformly in the poly-semiconductor gate.

Figure 9:
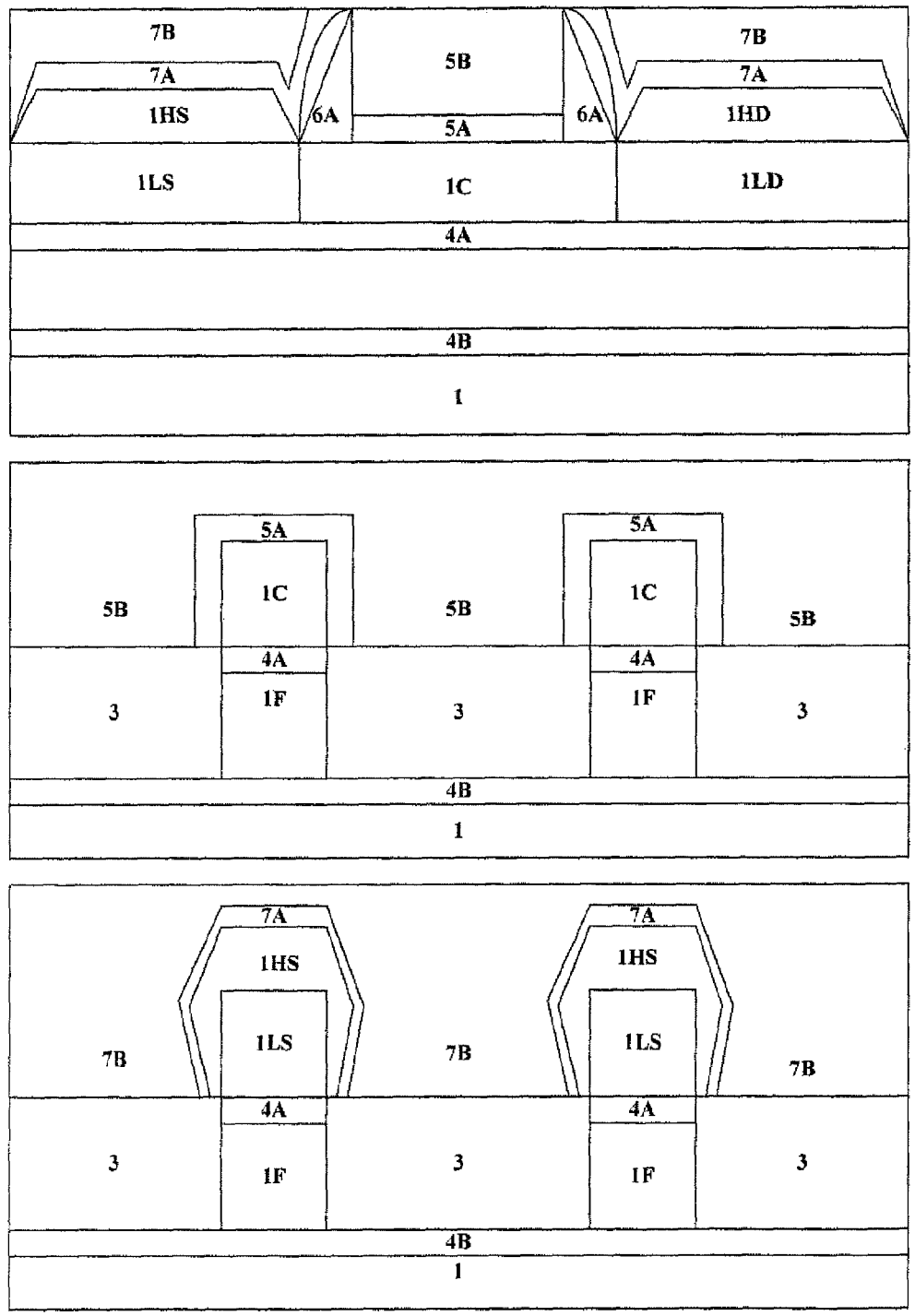

As shown in FIG. 9, a CESL 7A and an ILD 7B are formed on the whole device. Preferably, a CESL 7A of silicon nitride is firstly formed on the device by a process such as PECVD, HDPCVD, sputtering and the like (omissible). Then, an ILD 7B of silicon oxide with a low-k material is formed by a process such as spin coating, spray coating, screen printing, CVD, PVD and the like. The low-k material includes and is not limited to an organic low-k material (for example, an organic polymer containing aryl group or polycyclic group), an inorganic low-k material (for example, an amorphous carbon nitride film, a polycrystalline boron nitride film, silicon fluoride glass, BSG, PSG, or BPSG), a porous low-k material (for example, a porous silsesquioxane (SSQ) based low-k material, porous silicon dioxide, porous SiOCH, C-doped silicon dioxide, porous F-doped amorphous carbon, porous diamond, or porous organic polymer).

Figure 10:
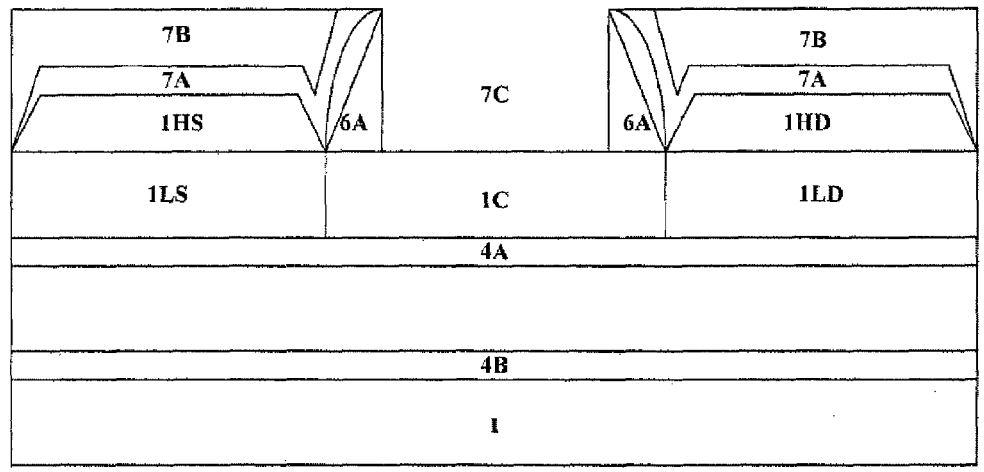
Figure 10:
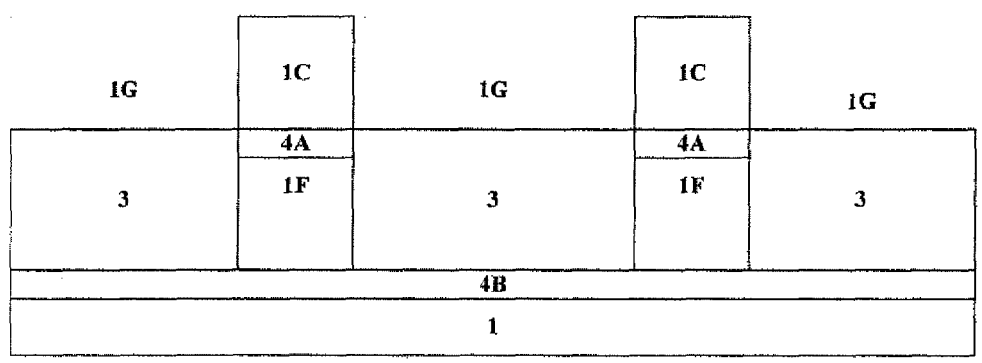
Figure 10:
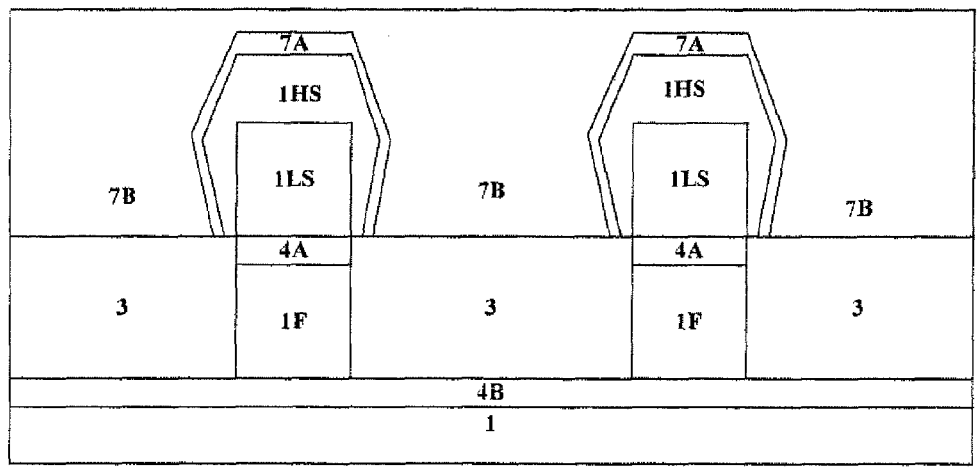

As shown in FIG. 10, the dummy gate stack structure 5A/5B are selectively etched to be removed until the channel regions 1C in the Fins 1F are exposed and a gate opening 7C is left in the ILD 7B. A suitable anisotropic etching process may be selected for the material of the dummy gate stack, for example, the TMAH wet process to remove poly-Si, amorphous Si, or plasma wet etching of oxygen to remove amorphous C, plasma wet etching of CF-based etching gas to remove the dummy gate insulating layer and the like.

Figure 11:
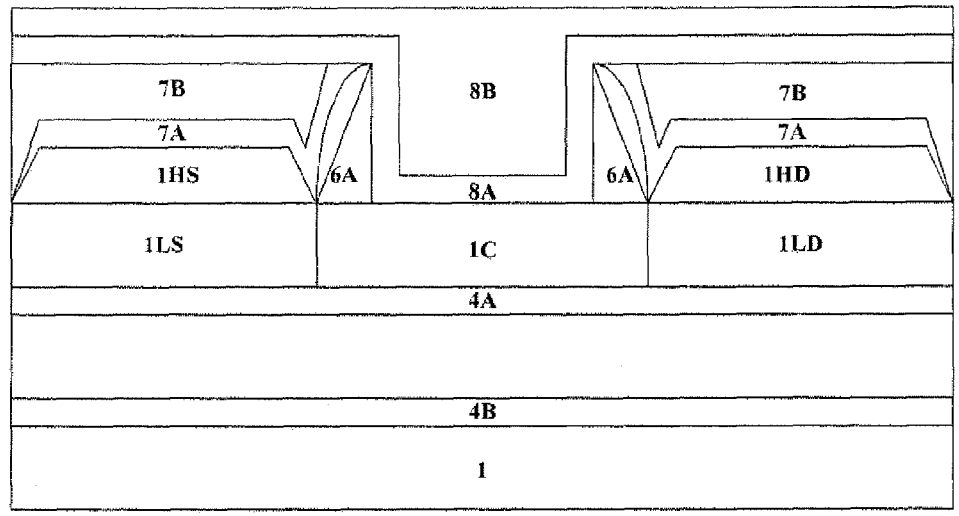
Figure 11:
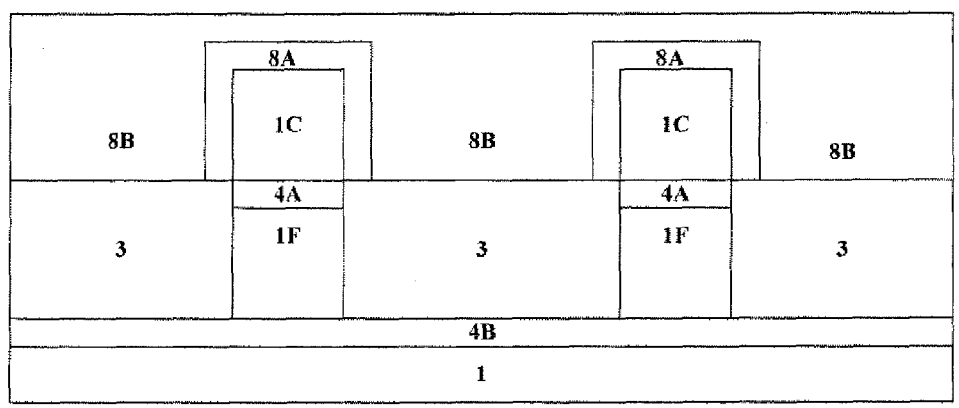
Figure 11:
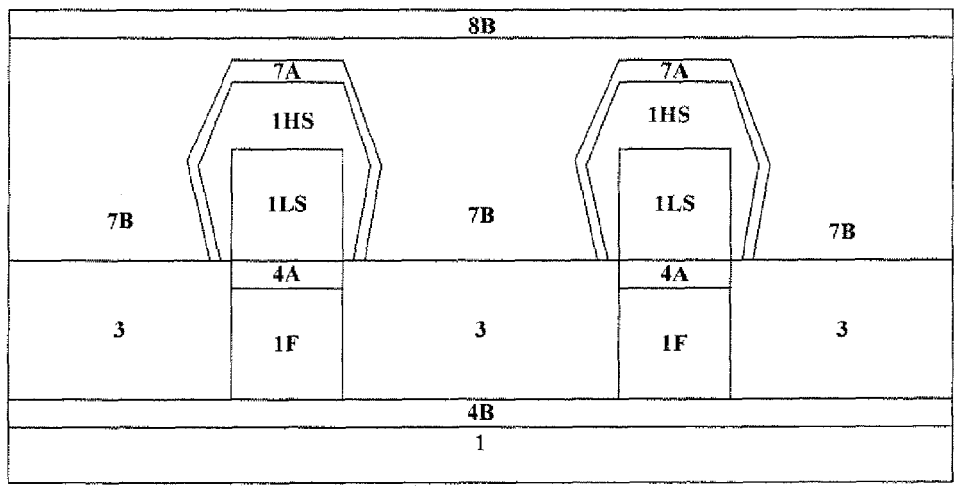

As shown in FIG. 11, a gate insulating layer 8A of high-k material and a gate conductive layer 8B of poly-semiconductor material are deposited on the whole device structure, to completely fill the gate opening 7C and cover the top surface of the ILD 7B. The deposition process may be a deposition process with high step coverage, such as PECVD, HDPCVD, MOCVD, MBE, ALD and the like. The high-k material of the gate insulating layer 8A includes and is not limited to an Hf-based material (in which the content of the oxygen atom x may be reasonably adjusted according to the ratio of the metal compositions and the chemical valence, for example, x may be 1-6 and is not to an integer number) selected from a group consisting of $HfO_2$, $HfSiO_x$, HfSiON, $HfAlO_x$, $HfTaO_x$, $HfLaO_x$, $HfAlSiO_x$ and $HfLaSiO_x$, or a rare earth element-based high-k dielectric material selected from a group consisting of $ZrO_2$, $La_2O_3$, $LaAlO_3$, $TiO_2$ and $Y_2O_3$, or $Al_2O_3$, or a composite layer of the above mentioned materials. The poly-semiconductor layer 8B may be of a material such as poly-Si, poly-SiGe, poly-Si:C, poly-Si:H, poly-Ge, poly-SiGeC, poly-GeSn, poly-SiSn, poly-InP, poly-GaN, poly-InSb, poly-carbonized semiconductor and the like. Process parameters may be selected, for example to improve a deposition temperature (850-1300 Celsius degree, for example) so that the poly-semiconductor layer of the above mentioned materials is formed in one step; or an amorphous or microcrystalline semiconductor layer of the above mentioned materials is firstly formed at a lower temperature (600-800 Celsius degree, for example), and then crystal particles in the semiconductor layer are recombined by a remedy process such as laser annealing, RTA annealing and the like to form the poly-semiconductor layer. It should be noted that as shown in the lower portion of FIG. 11, the poly-semiconductor layer 8B at least covers the top of the ILD 7B, to increase a total volume of the poly-semiconductor, so that non-uniformity of the doping directions and/or concentrations of a local area (such as a small-sized gate region) are eliminated by a large diffusion space during subsequent doping and annealing.

Figure 12:
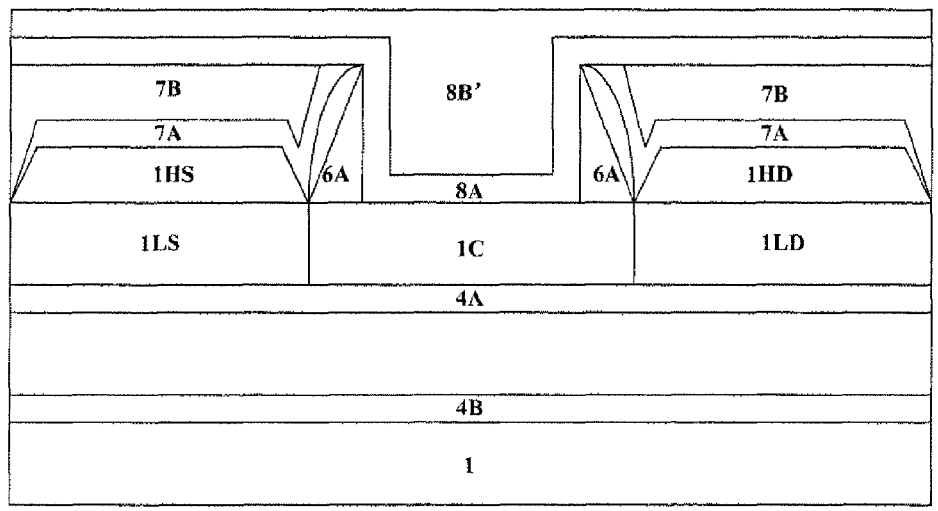
Figure 12:
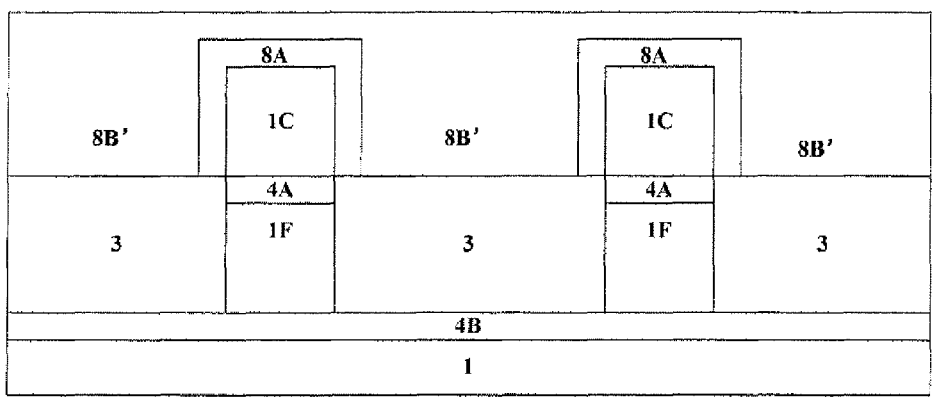
Figure 12:
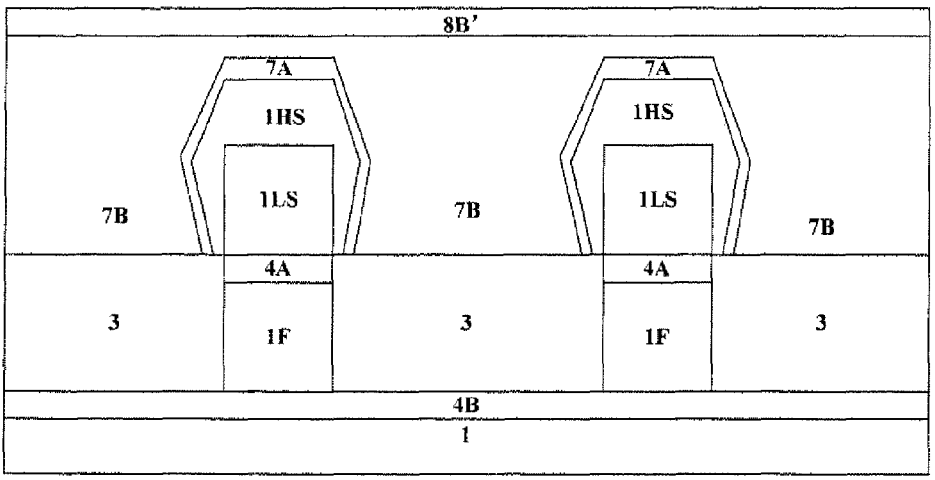

As shown in FIG. 12, the poly-semiconductor layer 8B is doped, to form a doped poly-semiconductor layer 8B'. In a preferable embodiment of the present disclosure, the poly-semiconductor gate may be doped with different dopants using ion implantation according to different device types, to adjust the required threshold voltage. For example, for pFinFET devices, impurities in the poly-semiconductor are p-type impurities which are selected from a group consisting of B, In, Ga, Al, Mg and Sn or combinations thereof and for nFinFET devices, the impurities in the poly-semiconductor are n-type impurities which are selected from a group consisting of P, As, Te, Se, Sb and S or combinations thereof. Then, preferably, the whole device is annealed (for example at a temperature of 600-800 Celsius degree for 1 second to 3 minutes), and the impurities are activated so that the impurities are distributed uniformly in the whole poly-semiconductor layer 8B, to form a doped poly-semiconductor layer 8B' as the gate conductive layer. At this time, dopants in the raised source/drain regions 1HS/1HD are subjected to annealing at a high temperature and are redistributed. In this way, the required junction depth and concentration distribution are obtained. At the same time, the annealing further mitigates the damages to the top of the Fins structure due to lightly doping implantation of the LDD/SDE and heavily doping implantation of the raised source/drain regions, and reduces the defects in the epitaxial layer, thereby felicitating improvement of the reliability of the devices by a simply process. It should be noted that in this process, as compared with the traditional process of firstly forming gate lines and then implementing doping and annealing, the device and method for manufacturing the same of the present disclosure implement implantation in a large area and then implement activation and annealing, thereby avoiding a giant jump of the doping concentration in a local area of the small-sized gate lines due to non-uniform distribution of the ion implantation directions or an occasional fluctuation of the plasma igniting injection system, and also improving uniformity of the distribution of the dopants in the doping layer 8B' through diffusion in a large area and at a long distance. In this way, it facilitates accurately control of the threshold voltage of the device, and can obtain stable and uniform electrical characteristics in different regions of the wafer.

Figure 13:
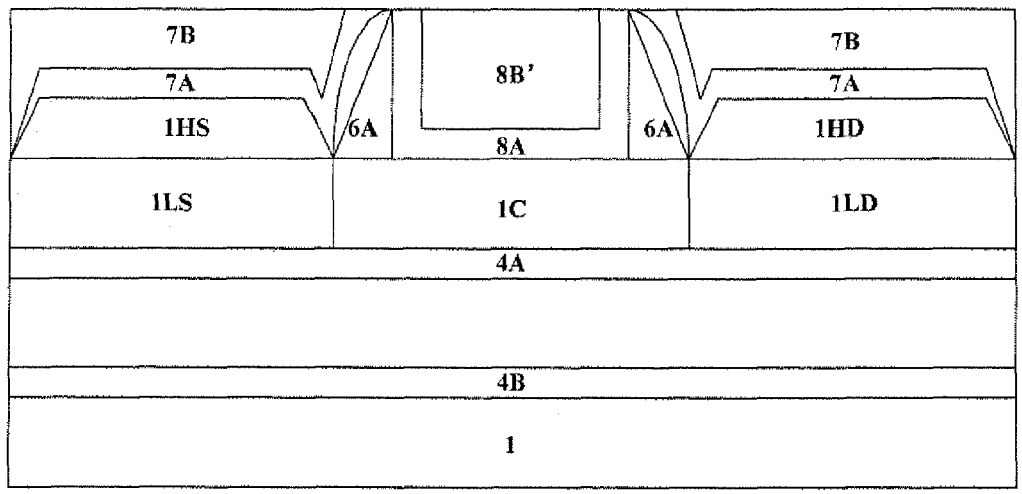
Figure 13:
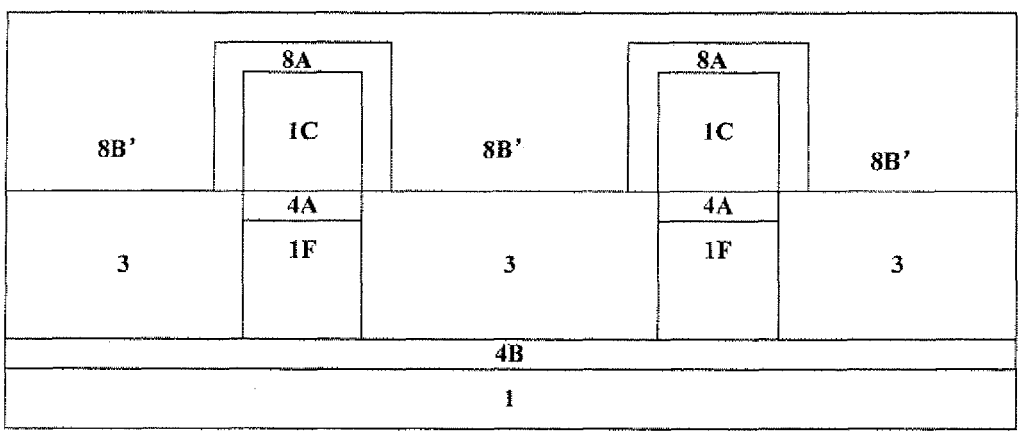
Figure 13:
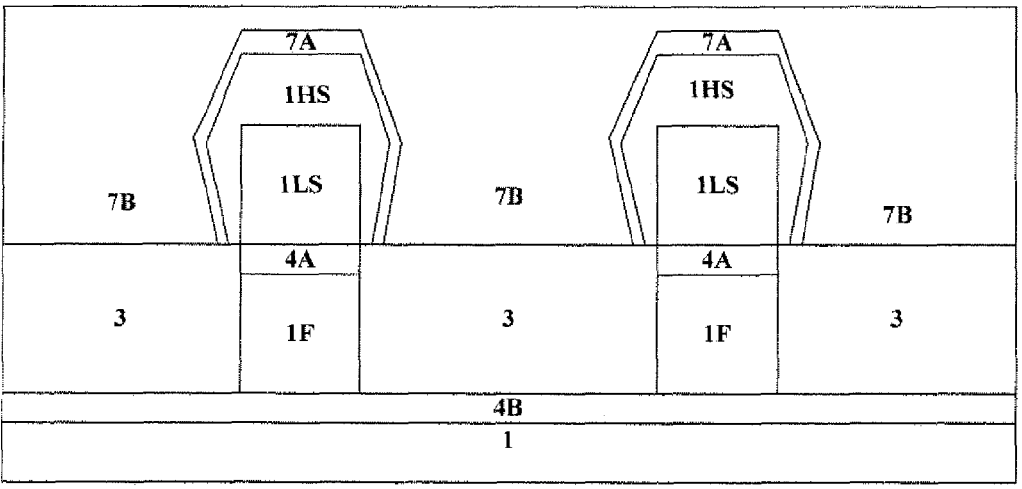

Finally, as shown in FIG. 13, layers 8B and 8A are processed by using a planarization process such as CMP or etch-back and the like, until the ILD 7B is exposed. Subsequently, an interconnection of the device is accomplished by a conventional process. For example, the ILD layer 7B and the contact etching stop layer 7A are etched in turn until the raised source/drain region 1HS/1HD is exposed to form a contact via. Preferably, the etching method may select an anisotropic dry etching, such as plasma etching or RIE. Preferably, a metal silicide (not shown) is formed on the source/drain region exposed by the contact via to decrease the contact resistance. For example, a metal layer (not shown) is formed in the contact via by evaporation, sputter, MOCVD, MBE, ALD and the like, and the material for the metal layer may be a metal such as Ni, Pt, Co, Ti, W and the like, and alloys of these metals. An anneal is implemented at a temperature of about 250-1000 Celsius degree for about 1 ms-10 min so that the metal or metal alloy reacts with the Si element contained in the source/drain region to form a metal silicide and to decrease the contact resistance. Subsequently, a contact metal layer is filled into the contact via, for example, by a process such as MOCVD, MBE, ALD, Evaporation, sputtering and the like to form the contact metal layer. Preferably, the material for the contact metal layer may be a material with a better extensibility, a higher filling rate and a lower cost, e.g. a metal such as W, Ti, Pt, Ta, Mo, Cu, Al, Ag, Au and the like, alloys of these metals and nitrides of these metals. Subsequently, a process such as CMP and etching back is used to planarize the contact metal layer until the CESL layer 7A is exposed.

A finally formed device has a structure as shown in FIG. 13, which comprises a plurality of Fin structures 1F extending on a substrate 1 along a first direction with a plurality of STIs 3 existing among the plurality of Fin structures 1F; a gate stack structure comprising a gate conductive layer 8B' and a gate insulating layer 8A across each Fin structure and extending along a second direction, with Fin structures beneath the gate stack structure 8 serving as trench regions 1C; and source/drain regions formed on the Fin structures at both sides of the gate stack along the first direction; wherein the gate conductive layer 8B' is formed by a doped poly-semiconductor. Other structures, materials and parameters and the like of the device have been described in the manufacturing process with reference to FIGS. 1-13, and will not be described here again.

According to the semiconductor device and the method for manufacturing the same of the present disclosure, in the gate-last process, after the poly-semiconductor gate is doped and then annealing is implemented synchronously on the poly-semiconductor gate and the source/drain regions at both sides thereof so that the dopants are uniformly distributed, which can effectively improve the adjusting accuracy of the threshold voltage of the doped poly-semiconductor gate, and suppress SCE at a low cost.

The present disclosure has been described above with reference to one or more example embodiments. It should be understood that various suitable alternations and equivalents can be made to the device structure and/or process by one skilled person in the art without departing from the spirits and scope of the present disclosure. Moreover, the teachings of the present disclosure may make various modifications which may be adapted for particular situations or materials without departing from the spirits and scope of the present disclosure. Therefore, the object of the present disclosure is not limited to the above particular embodiments as preferably implementations of the present disclosure. The device structure and the manufacture method thereof as disclosed will include all of embodiments falling within the scope of the present disclosure.

What is claimed is:

1. A method for manufacturing a semiconductor device, comprising the steps of:
   forming a plurality of Fins extending along a first direction on a substrate;
   forming a dummy gate stack structure extending along a second direction on the Fins;
   forming doped source/drain regions in and/or on the Fins at both sides of the dummy gate stack structure along the first direction, and forming channel regions in a part of the Fins between the source/drain regions beneath the dummy gate stack structure;
   forming an inter-layer dielectric layer on the substrate, and selectively etching to remove the dummy gate stack structure and leave the gate trenches in the inter-layer dielectric layer;
   prior to forming the gate stack structure, implementing ion implantation to form a punch through stop layer in the middle of the Fins;
   depositing a gate insulating layer and a poly-semiconductor layer in turn in the gate trenches and on top of the inter-layer dielectric layer;
   doping the poly-semiconductor layer to form a doped poly-semiconductor layer as a gate conductive layer; and
   implementing activation and annealing to activate the dopants in the source/drain regions and the gate conductive layer at the same time, so as to facilitate the dopants to be uniformly distributed in the gate conductive layer.

2. The method according to claim 1, further comprising the step of:

prior to forming the gate stack structure, implementing ion implantation to form a punch through stop layer at the bottom of the Fins.

3. A method for manufacturing a semiconductor device, comprising the steps of:
- forming a plurality of Fins extending along a first direction on a substrate;
- forming a dummy gate stack structure extending along a second direction on the Fins;
- forming doped source/drain regions in and/or on the Fins at both sides of the dummy gate stack structure along the first direction, and forming channel regions in a part of the Fins between the source/drain regions beneath the dummy gate stack structure;
- forming an inter-layer dielectric layer on the substrate, and selectively etching to remove the dummy gate stack structure and leave the gate trenches in the inter-layer dielectric layer;
- prior to forming the gate stack structure, implementing ion implantation to form a punch through stop layer in the middle and at the bottom of the Fins;
- depositing a gate insulating layer and a poly-semiconductor layer in turn in the gate trenches and on top of the inter-layer dielectric layer;
- doping the poly-semiconductor layer to form a doped poly-semiconductor layer as a gate conductive layer; and
- implementing activation and annealing to activate the dopants in the source/drain regions and the gate conductive layer at the same time, so as to facilitate the dopants to be uniformly distributed in the gate conductive layer.

4. The method according to claim 1 or 3, wherein the doped poly-semiconductor comprises a material selected from a group consisting of poly-Si, poly-SiGe, poly-Si:C, poly-Si:H, poly-Ge, poly-SiGeC, poly-GeSn, poly-SiSn, poly-InP, poly-GaN, poly-InSb, and poly-carbonized semiconductor or combinations thereof.

5. The method according to claim 1 or 3, wherein forming source/drain regions further comprises the steps of:
- forming a first gate spacer at both sides of the dummy gate stack structure;
- implementing lightly-doping ion implantation on the Fins by taking the first gate spacer as a mask, to form source/drain extension regions;
- epitaxially growing raised source/drain regions on the source/drain extension regions at both sides of the first gate spacer;
- forming a second gate spacer at both sides of the first gate spacer; and
- implementing heavily-doping ion implantation on the raised source/drain regions by taking the second gate spacer as a mask.

6. The method according to claim 5, wherein the lightly doping ion implantation is ion implantation in an inclination angle, wherein the inclination angle is adjusted to control a junction depth of the extended source/drain regions.

7. The method according to claim 1 or 3, wherein, after implementing activation and annealing, the gate conductive layer and the gate insulating layer are planarized until the inter-layer dielectric layer is exposed.

8. The method according to claim 1 or 3, wherein for pFinFET devices, impurities in the poly-semiconductor are p-type impurities which are selected from a group consisting of B, In, Ga, Al, Mg and Sn or combinations thereof.

9. The method according to claim 1 or 3, wherein for nFinFET devices, the impurities in the poly-semiconductor are n-type impurities which are selected from a group consisting of P, As, Te, Se, Sb and S or combinations thereof.

* * * * *